(12) United States Patent
Wang et al.

(10) Patent No.: US 7,368,750 B2
(45) Date of Patent: May 6, 2008

(54) SEMICONDUCTOR LIGHT-RECEIVING DEVICE

(75) Inventors: Gang Wang, Yamanashi (JP); Yoshihiro Yoneda, Yamanashi (JP)

(73) Assignee: Fujitsu Quantum Devices Limited, Yamanishi (JP)

( * ) Notice: Subject to any disclaimer, the term of this patent is extended or adjusted under 35 U.S.C. 154(b) by 0 days.

(21) Appl. No.: 10/665,204

(22) Filed: Sep. 22, 2003

(65) Prior Publication Data

US 2004/0056250 A1    Mar. 25, 2004

(30) Foreign Application Priority Data

Sep. 20, 2002   (JP)   ............... 2002-274305

(51) Int. Cl.
*H01L 29/04*    (2006.01)
*H01L 31/036*   (2006.01)

(52) U.S. Cl. ............... 257/53; 257/101; 257/103; 257/E31.063; 257/E31.116; 257/E31.128; 257/E31.061; 257/E31.114

(58) Field of Classification Search ........ 257/184–186, 257/101–103, 431, 432, 461, 53
See application file for complete search history.

(56) References Cited

U.S. PATENT DOCUMENTS

| | | | | |
|---|---|---|---|---|
| 5,557,117 A | * | 9/1996 | Matsuoka et al. | ........... 257/184 |
| 5,569,942 A | * | 10/1996 | Kusakabe | ................... 257/186 |
| 5,654,578 A | * | 8/1997 | Watanabe | ................... 257/438 |
| 5,800,630 A | * | 9/1998 | Vilela et al. | ................. 136/249 |
| 5,825,047 A | * | 10/1998 | Ajisawa et al. | ............... 257/12 |
| 5,998,851 A | * | 12/1999 | Nishikata | ..................... 257/436 |
| 6,172,382 B1 | * | 1/2001 | Nagahama et al. | .......... 257/94 |
| 6,426,236 B1 | * | 7/2002 | Ishizaka et al. | .............. 438/29 |
| 6,664,573 B2 | * | 12/2003 | Kim et al. | ................... 257/186 |
| 7,105,798 B2 | * | 9/2006 | Wang et al. | ............. 250/214.1 |
| 2001/0048118 A1 | * | 12/2001 | Uchida et al. | .............. 257/190 |
| 2002/0149827 A1 | * | 10/2002 | Fujimura et al. | ........... 359/228 |
| 2003/0211648 A1 | * | 11/2003 | Buchanan et al. | ............ 438/48 |

FOREIGN PATENT DOCUMENTS

| JP | 59-161082 | * | 9/1984 |
|---|---|---|---|
| JP | 63-124475 | * | 5/1988 |

(Continued)

OTHER PUBLICATIONS

Japanese Office Action dated May 8, 2007.

*Primary Examiner*—A. Sefer
(74) *Attorney, Agent, or Firm*—Kratz, Quintos & Hanson, LLP (57) ABSTRACT

A semiconductor light-receiving device includes: a semi-insulating substrate; a semiconductor layer of a first conduction type that is formed on the semi-insulating substrate; a buffer layer of the first conduction type that is formed on the semi-insulating substrate and has a lower impurity concentration than the semiconductor layer of the first conduction type; a light absorption layer that is formed on the buffer layer and generates carriers in accordance with incident light; a semiconductor layer of a second conduction type that is formed on the light absorption layer; and a semiconductor intermediate layer that is interposed between the buffer layer and the light absorption layer, and has a forbidden bandwidth within a range lying between the forbidden bandwidth of the buffer layer and the forbidden bandwidth of the light absorption layer.

8 Claims, 5 Drawing Sheets

FOREIGN PATENT DOCUMENTS

| | | | |
|---|---|---|---|
| JP | 2-65279 | | 3/1990 |
| JP | 2-228080 | | 9/1990 |
| JP | 6-61521 | | 3/1994 |
| JP | 6-90016 | * | 3/1994 |
| JP | 6-326120 | | 11/1994 |
| JP | 8-8456 | * | 1/1996 |
| JP | 10-270741 | * | 10/1998 |
| JP | 2000-261026 | | 9/2000 |
| JP | 2001-127333 | | 5/2001 |
| JP | 2002-203981 | | 7/2002 |

* cited by examiner

SEMICONDUCTOR LIGHT-RECEIVING DEVICE

BACKGROUND OF THE INVENTION

1. Field of the Invention

The present invention generally relates to a semiconductor light-receiving device, and more particularly, to a PIN-type photodiode that can perform high-speed operations and can be used in large-capacity optical fiber communication systems.

2. Description of the Related Art

As optical communication systems have been rapidly increasing in capacity, transmission systems with 40 Gbps or higher have been developed in recent years. Semiconductor light-receiving devices to be used in such large-capacity transmission systems need to be capable of operating at high-speed of 40 GHz or higher, and therefore, need to exhibit higher performance and higher reliability than conventional semiconductor light-receiving devices.

Figure 8:
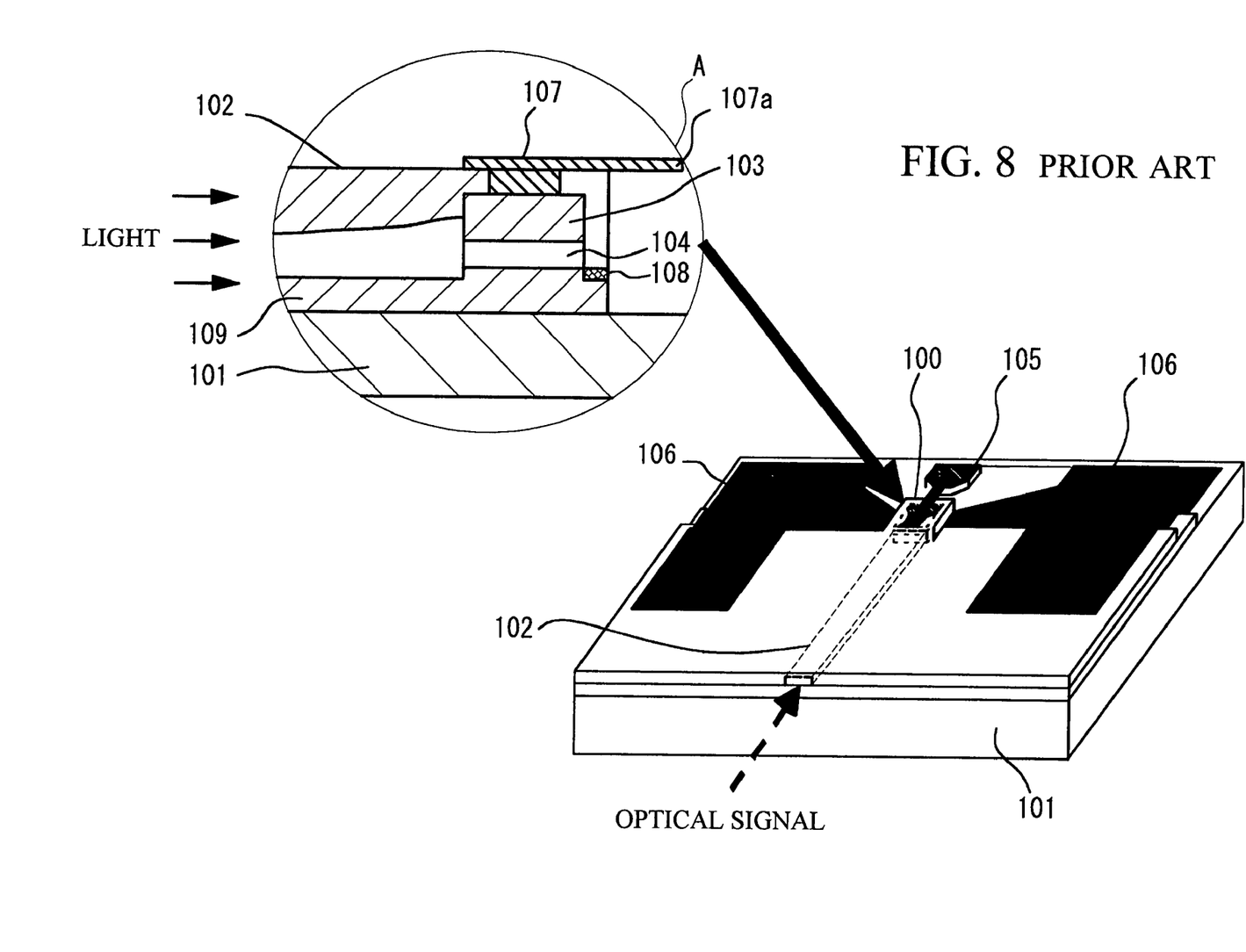
FIG. 8 is a perspective view of a conventional semiconductor light-receiving device.

Japanese Unexamined Patent Publication No. 2001-127333 discloses this type of semiconductor light-receiving device in the form of a PIN-type photodiode having a tapered optical waveguide structure integrated therein. FIG. 8 is a perspective view of an example structure of the PIN-type photodiode having a tapered optical waveguide structure integrated therein. In the circle denoted by A in FIG. 8, an enlarged section view of the light receiving unit of the photodiode is shown. As can be seen from FIG. 8, the photodiode 100 has a tapered optical waveguide structure 102 connected to a side surface of a light receiving element 103 on a semi-insulating InP substrate 101. The tapered optical waveguide structure 102 converts the size of light transmitted from optical fibers into a spot size, and then sends the converted light into the light receiving element 103 through a side surface of a light absorption layer 104.

A p-side electrode pad 105 of a predetermined shape is provided on the substrate 101, with an insulating film being interposed in between. Also, n-side electrode pads 106 are provided on the same plane as the p-side electrode pad 105. Accordingly, this photodiode 100 can be connected directly to a substrate of a coplanar strip line substrate. A P-type electrode 107 is formed on top of the light receiving element 103. The P-type electrode 107 is connected to the p-side electrode pad 105 by an air bridge 107a.

An N-type electrode 108 is formed on the surface of an N-type semiconductor layer 109 that is exposed by etching performed on the light receiving element 103 to form a mesa structure. The N-type electrode 108 is connected to the n-side electrode pads 106 extending onto the semiconductor layer 109. The n-side electrode pads 106 occupy large areas to secure a connection region for a bypass capacitor (later described) and to securely provide a ground potential to the N-type electrode 108 in a high-frequency operation.

Figure 9:
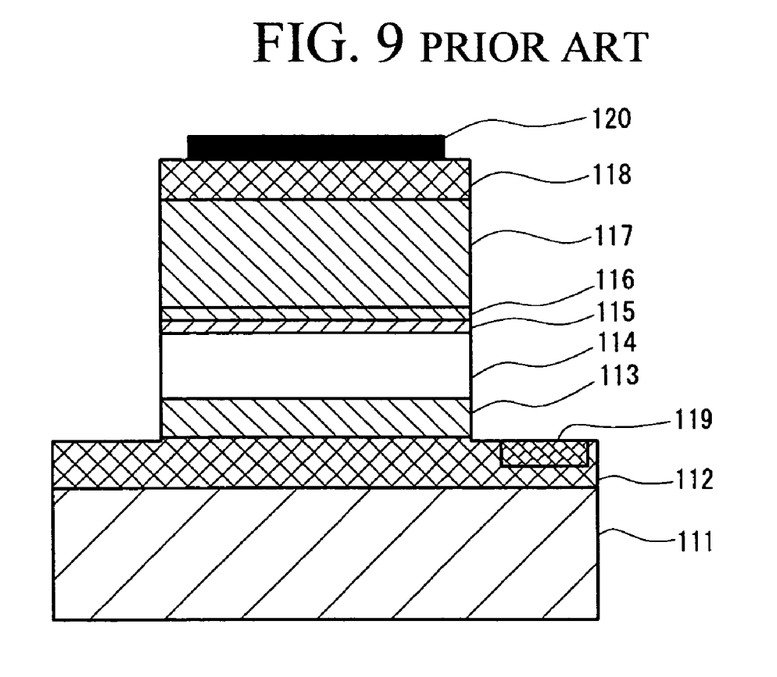
FIG. 9 is a section view of a conventional PIN-type photodiode.

FIG. 9 illustrates an example structure of such a PIN-type photodiode. An $N^+$-InP contact layer 112, an $N^-$-InP buffer layer 113, an undoped InGaAs light absorption layer 114, $P^-$-InGaAsP composition graded layers 115 and 116, a $P^+$-InP layer 117, and a $P^+$-InGaAsP contact layer 118, are stacked in this order on an InP semiconductor substrate 111, as shown in FIG. 9. Etching is then performed on these semiconductor layers to form a mesa structure.

An N-side electrode 119 is ohmically connected to the N-side contact layer 112 with a double-layered metal of Au and Ge, for example. Also, a P-side electrode 120 is ohmically connected to the P-side contact layer 118 with a double-layered metal of Au and Zn, for example.

When the photodiode is operating, the N-side electrode 119 has a positive potential, the P-side electrode 120 has a ground potential, and the P-type semiconductor layer 117 and the N-type buffer layer 113 are reverse-biased. When carriers are generated by light incidence into the light absorption layer 114, electrons are taken out by the N-side electrode 119, while holes are taken out by the P-side electrode 120.

The response speed of the above receiving element is basically determined by the CR time constant and the running time of the carriers (mostly holes) in the depletion layer. To restrain the hole trapping by the heterobarrier at the interface between the P-type semiconductor layer 117 and the light absorption layer 114, the semiconductor intermediate layers (or the graded layers) 115 and 116 of graded compositions are interposed in between. Meanwhile, to reduce the PN junction capacity of the light receiving unit without increasing the running time of the holes, the buffer layer 113 is provided under the light absorption layer 114. The impurity concentration in the buffer layer 113 is made as small as $1\times10^{16}$ cm$^{-3}$, so that the thickness of the depletion region formed in the buffer layer 113 is increased. Accordingly, the electrostatic capacity C is reduced, and the response speed is increased.

In the conventional PIN-type photodiode having the buffer layer 113 to reduce the electrostatic capacity, however, adverse influence of electron trapping cannot be avoided due to the heterobarrier formed at the interface between the light absorption layer 114 and the buffer layer 113. If the impurity concentration in the buffer layer 113 becomes lower than $1\times10^{17}$ cm$^{-3}$ in practice, the band discontinuity between the buffer layer 113 and the light absorption layer 114 becomes an obstacle to the running of electrons. Particularly, when a high-speed operation with high-intensity light incidence is performed at 40 GHz or higher, the trapping time of not only holes but also electrons, due to the band discontinuity, becomes so long as to cause the problem of poor frequency response characteristics.

SUMMARY OF THE INVENTION

It is therefore an object of the present invention to provide a semiconductor light-receiving device in which the above disadvantage is eliminated.

A more specific object of the present invention is to provide a semiconductor light-receiving device that can perform high-speed operations.

An even more specific object of the present invention is to provide a semiconductor light-receiving device that can exhibit excellent frequency response characteristics with high-intensity light incidence in an operation performed at 40 GHz or higher.

The these objects of the present invention are also achieved by a semiconductor light-receiving device comprising: a semi-insulating substrate; a semiconductor layer of a first conduction type that is formed on the semi-insulating substrate; a buffer layer of the first conduction type that is formed on the semi-insulating substrate and has a lower impurity concentration than the semiconductor layer of the first conduction type; a light absorption layer that is formed on the buffer layer and generates carriers in accordance with incident light; a semiconductor layer of a second conduction type that is formed on the light absorption layer; and a semiconductor intermediate layer that is interposed between the buffer layer and the light absorption layer, and has a forbidden bandwidth within a range lying between the forbidden bandwidth of the buffer layer and the forbidden bandwidth of the light absorption layer.

The above objects of the present invention are achieved by a semiconductor light-receiving device comprising: a semiconductor substrate of a first conduction type; a buffer layer of the first conduction type that is formed on the semiconductor substrate and has a lower impurity concentration than the semiconductor substrate; a light absorption layer that is formed on the buffer layer and generates carriers in accordance with incident light; a semiconductor layer of a second conduction type that is formed on the light absorption layer; and a semiconductor intermediate layer that is interposed between the buffer layer and the light absorption layer, and has a forbidden bandwidth within a range lying between the forbidden bandwidth of the buffer layer and the forbidden bandwidth of the light absorption layer.

The above objects of the present invention are also achieved by a semiconductor light-receiving device comprising: a semi-insulating substrate; a semiconductor layer of a first conduction type that is formed on the semi-insulating substrate; a buffer layer of the first conduction type that is formed on the semiconductor layer; a light absorption layer that is formed on the buffer layer and generates carriers in accordance with incident light; a semiconductor layer of a second conduction type that is formed on the light absorption layer; and a high-concentration semiconductor intermediate layer of the first conduction type that is interposed between the buffer layer and the light absorption layer and has a higher impurity concentration than the buffer layer.

The above objects of the present invention are also achieved by a semiconductor light-receiving device comprising: a semiconductor substrate of a first conduction type; a buffer layer of the first conduction type that is formed on the semiconductor substrate and has a lower impurity concentration than the semiconductor substrate; a light absorption layer that is formed on the buffer layer and generates carriers in accordance with incident light; a semiconductor layer of a second conduction type that is formed on the light absorption layer; and a high-concentration semiconductor intermediate layer of the first conduction type that is interposed between the buffer layer and the light absorption layer and has a higher impurity concentration than the buffer layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

Figure 1:
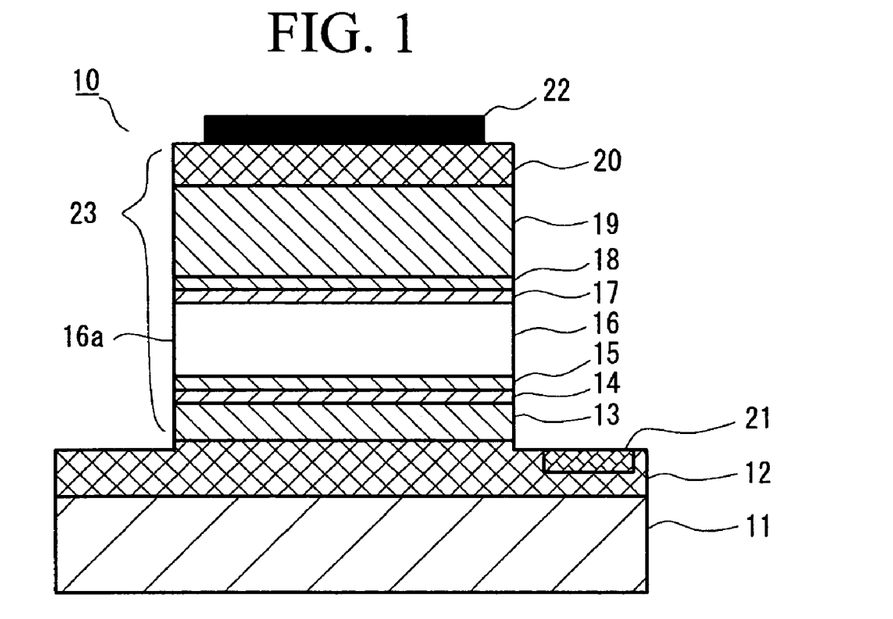
FIG. 1 is a section view of a PIN-type photodiode in accordance with a first embodiment of the present invention.

FIG. 1 is a section view of a PIN-type photodiode in accordance with a first embodiment of the present invention. The PIN-type photodiode 10 of this embodiment includes an $N^+$-InP contact layer 12 having a high impurity concentration, an $N^-$-InP buffer layer 13 having a low impurity concentration ($1 \times 10^{16}$ cm$^{-3}$), N-type InGaAsP composition graded layers 14 and 15, an undoped InGaAs light absorption layer 16, P-type InGaAsP composition graded layers 17 and 18, a $P^+$-InP layer 19 having a high impurity concentration, and a $P^+$-InGaAsP contact layer 20 having a high impurity concentration. As shown in FIG. 1, those layers 12 through 20 are stacked in that order on a semi-insulating semiconductor substrate 11 made of InP, for example.

An N-side electrode 21 made of a double-layered metal of Au and Ge is ohmically connected to the contact layer 12. A P-side electrode 22 made of a double-layered metal of Au and Zn is ohmically connected to the contact layer 20. When the photodiode 10 is operating, a positive potential is supplied from an external power source to the N-side electrode 21, while a ground potential is supplied to the P-side electrode 22.

The InGaAsP composition graded layers 14 and 15 are semiconductor intermediate layers that are interposed between the buffer layer 13 and the light absorption layer 16, and that have bandgaps between the bandgap (forbidden bandwidth) of the buffer layer 13 and the bandgap of the light absorption layer 16. Preferably, the composition graded layer 14 has a bandgap equivalent to a wavelength of 1.1 μm, and the composition graded layer 15 has a bandgap equivalent to 1.3 μm. With the composition graded layers 14 and 15 being interposed, the bandgaps can be gradually increased from the light absorption layer 16 of a narrow bandgap toward the buffer layer 13 of a wide bandgap. Accordingly, the heterobarrier at the interface between the buffer layer 13 and the light absorption layer 16 can be softened.

The P-side composition graded layers 17 and 18 also reduce the band discontinuity between the light absorption layer 16 and the P-type semiconductor layer 19. Preferably, the compositions should be selected so that the composition graded layer 17 has a bandgap equivalent to a wavelength of 1.3 μm, and that the composition graded layer 18 has a bandgap equivalent to 1.1 μm.

A mesa structure 23 is formed as a light receiving unit on the semiconductor substrate 11. The mesa structure 23 is created by etching the semiconductor layers from the contact layer 20 to the buffer layer 13. Through the etching, the contact layer 12 is partially exposed. Although not shown in the drawing, an optical waveguide path may be formed on the semiconductor substrate 11, and be coupled to the mesa structure 23. In that case, light is guided through the optical waveguide path, and then enters the light absorption layer 16 through a side surface 16a.

When the PIN-type photodiode 10 is to be operated, a predetermined potential is supplied to each of the N-side electrode 21 and the P-side electrode, and a reverse bias is applied to the light receiving unit. With light entering the light absorption layer 16 through the side surface 16a, electrons and holes are generated in the light absorption layer 16, and these carriers move in the thickness direction of the light absorption layer 16. As the composition graded layers 14 and 15 are interposed between the light absorption layer 16 and the buffer layer 13, the heterobarrier between the light absorption layer 16 and the buffer layer 13 is softened, and electron trapping there is avoided or restrained.

Figure 7:
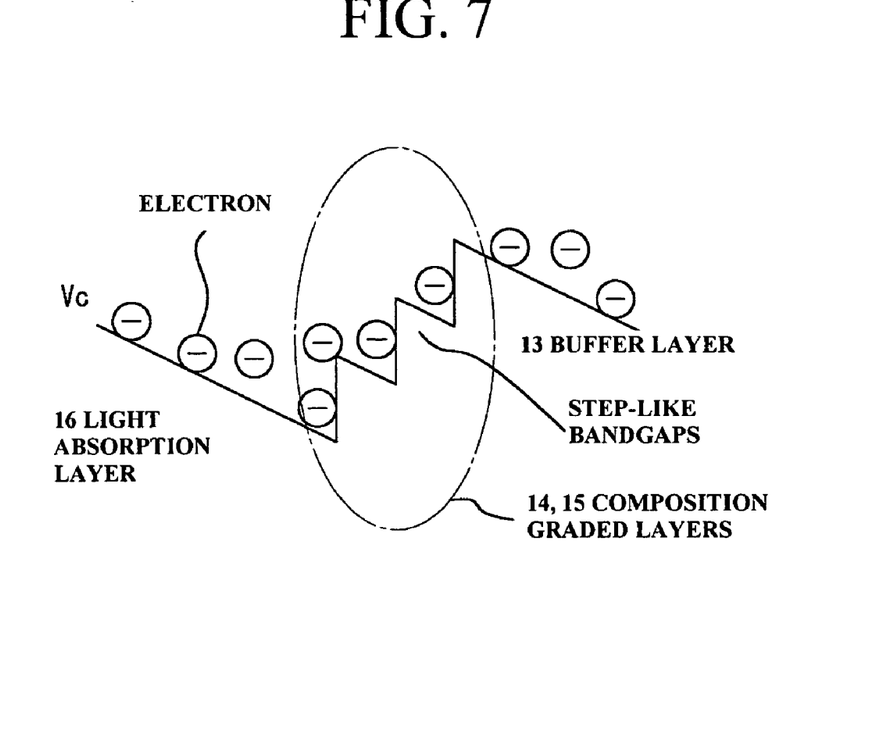
FIG. 7 illustrates the drift of electrons generated by light in the light receiving unit of the PIN-type photodiode of the first embodiment.

FIG. 7 illustrates a situation in which electrons generated in the light absorption layer 16 drift in the thickness direction, and the conditions of the conduction band in the composition graded layers 14 and 15 and the surrounding regions. As can be seen from this drawing, two steps are created between the light absorption layer 16 and the buffer layer 13, with the composition graded layers 14 and 15 being interposed in between. With these steps, electrons are not directly affected by the great difference in energy between the light absorption layer 16 and the buffer layer 13. Thus, electrons can be smoothly taken out through the N-side electrode 21, and the response speed of the photodiode 10 is increased. As a result, the frequency response characteristics can be improved. The photodiode 10 thus formed can operate well at frequencies over 40 GHz.

Likewise, the composition graded layers 17 and 18 soften the band discontinuity between the light absorption layer 16 and the P-type semiconductor layer 19. Thus, holes generated in the light absorption layer 16 are prevented from being trapped by the heterobarrier, and are taken out through the P-side electrode 22.

Although an undoped InGaAs layer is employed as the light absorption layer 16 in the first embodiment, it is also possible to employ a P-type or N-type InGaAs layer. Further, the two composition graded layers 14 and 15 are employed in the above embodiment. However, the number of composition graded layers to be employed in the photodiode 10 is not limited to two. The bandgaps of the composition graded layers 14 and 15 may be arbitrarily changed, as long as the bandgaps are within the range lying between the bandgap of the light absorption layer 16 and the bandgap of the buffer layer 13. It is possible to employ a structure in which the semiconductor intermediate layer includes two or more semiconductor layers, and the forbidden bandwidth of each semiconductor layer periodically changes, for example.

Figure 2:
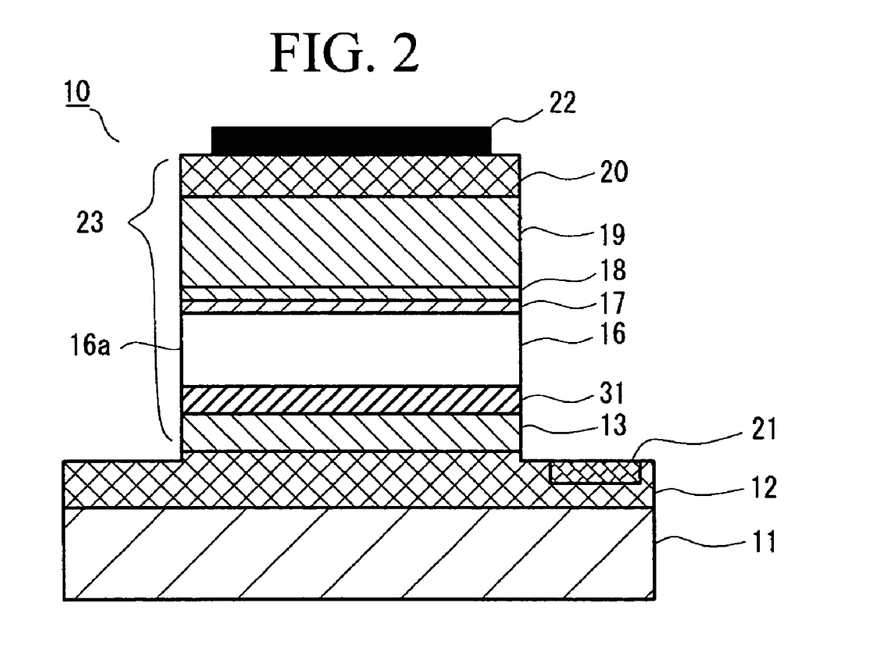
FIG. 2 is a section view of a PIN-type photodiode in accordance with a second embodiment of the present invention.

Referring now to FIG. 2, a second embodiment of the present invention will be described. FIG. 2 is a section view of a PIN-type photodiode in accordance with the second embodiment. In FIG. 2, the same components as those of the first embodiment are denoted by the same reference numerals as the corresponding ones in FIG. 1. Instead of composition graded layers, a semiconductor intermediate layer 31 having a high impurity concentration is interposed between the buffer layer 13 and the light absorption layer 16 in this embodiment.

The semiconductor intermediate layer 31 is an N$^+$-InP layer having an impurity concentration of $2 \times 10^{18}$ cm$^{-3}$, preferably with a film thickness of 100 nm or smaller. As the thin-film semiconductor intermediate layer 31 having a high impurity concentration is interposed, electrons generated in the light absorption layer 16 can go through the heterobarrier at the interface between the buffer layer 13 and the light absorption layer 16 by virtue of a tunnel effect. Accordingly, electrons are not adversely affected by the band discontinuity between the light absorption layer 16 and the buffer layer 13, and can smoothly reach the N-side electrode 21. The electrons that have reached the N-side electrode 21 are then taken out. Thus, the high-frequency response characteristics and the high-input saturation characteristics of the photodiode can be improved.

Figure 3:
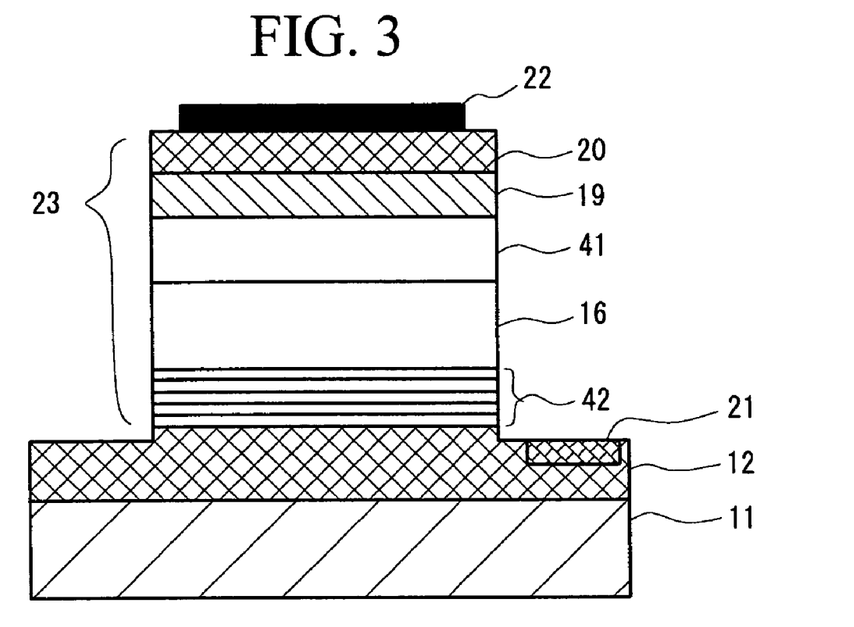
FIG. 3 is a section view of a PIN-type photodiode in accordance with a third embodiment of the present invention.

Referring now to FIG. 3, a third embodiment of the present invention will be described. FIG. 3 is a section view of a PIN-type photodiode in accordance with the third embodiment. In this drawing, the same components as those of the first embodiment are denoted by the same reference numerals as the corresponding ones in FIG. 1. The photodiode of this embodiment has a P$^+$-InGaAsP cladding layer 41 on the light absorption layer 16, and a cladding layer 42 having a number of N-InGaAsP films stacked under the light absorption layer 16. The cladding layer 41 has a bandgap equivalent to a wavelength of 1.3 μm, and the cladding layer 42 has bandgaps varying from 1.1 μm to 1.3 μm in wavelength.

Being a low-concentration layer with a lower impurity concentration than the contact layer 12, the cladding layer 42 can also assume the function of the buffer layer 13 of the foregoing embodiments. Accordingly, the cladding layer 42 reduces the junction capacity of the light receiving unit. Further, the cladding layer 42 has an intermediate bandgap between the light absorption layer 16 and the contact layer 12. Accordingly, the band discontinuity between the light absorption layer 16 and the contact layer 12 is softened, and electron trapping by the heterobarrier can be avoided or restrained.

Since the cladding layers 41 and 42 each has a wider bandgap than that of the light absorption layer 16 and a high impurity concentration, the reflectance of each of the cladding layers 41 and 42 is lower than that of the light absorption layer 16. Accordingly, light that has entered the light absorption layer 16 is confined therein by the cladding layers 41 and 42, so that carriers can be promptly generated in accordance with the quantity of incident light in the light absorption layer 16. Meanwhile, the carriers generated in the light absorption layer 16 are not confined by the cladding layers 41 and 42, and quickly move toward the N-side electrode 21 through the heterobarrier at the interface of the light absorption layer 16.

Although the cladding layer 42 also serves as a buffer layer in this embodiment, it is also possible to interpose a buffer layer between the cladding layer 42 and the contact layer 12.

Figure 4:
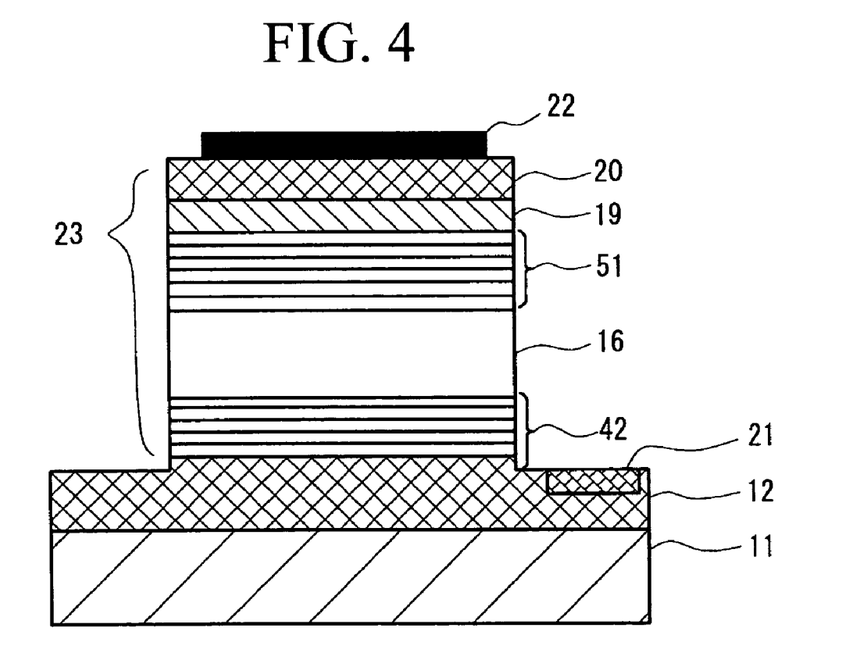
FIG. 4 is a section view of a PIN-type photodiode in accordance with a fourth embodiment of the present invention.

Referring now to FIG. 4, a fourth embodiment of the present invention will be described. FIG. 4 is a section view of a PIN-type photodiode in accordance with the fourth embodiment. In this drawing, the same components as those of the first embodiment are denoted by the same reference numerals as the corresponding ones in FIG. 1.

This embodiment is substantially the same as the third embodiment, except that the P-side cladding layer 41 is replaced with a multi-layered cladding layer 51. The cladding layer 51 has a number of P$^-$-InGaAsP films stacked on one another, with bandgaps varying from 1.1 μm to 1.3 μm in wavelength. With the multi-layered cladding layer 51 having the varied bandgaps, the hole trapping by the heterobarrier can be more effectively restrained. Thus, the high-frequency response characteristics and high-input saturation characteristics of the photodiode can be improved.

Figure 5:
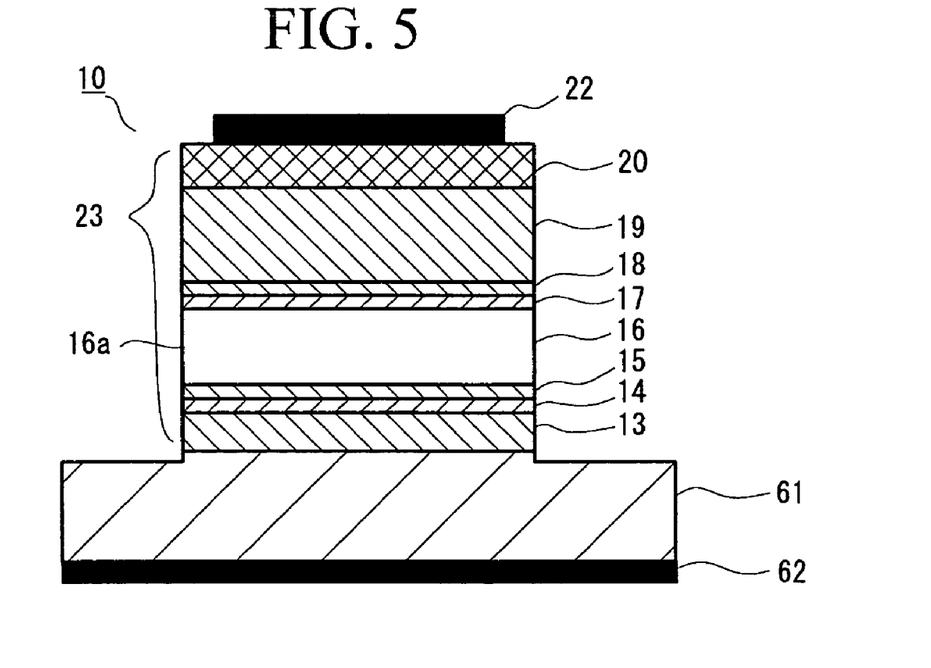
FIG. 5 is a section view of a modification of a PIN-type photodiode in accordance with the present invention.

Although the N-side electrode is formed on the semiconductor substrate 11 in the foregoing embodiments, it is possible to form an electrode on the bottom surface of a semiconductor substrate. The N-side electrode of the PIN-type photodiode shown in FIG. 1 may be modified, for example, to form an electrode layer 62 as an N-side electrode on the bottom surface of an N-type semiconductor substrate 61 having a low impurity concentration, as shown in FIG. 5. In this case, the contact layer 12 must be removed.

Figure 6:
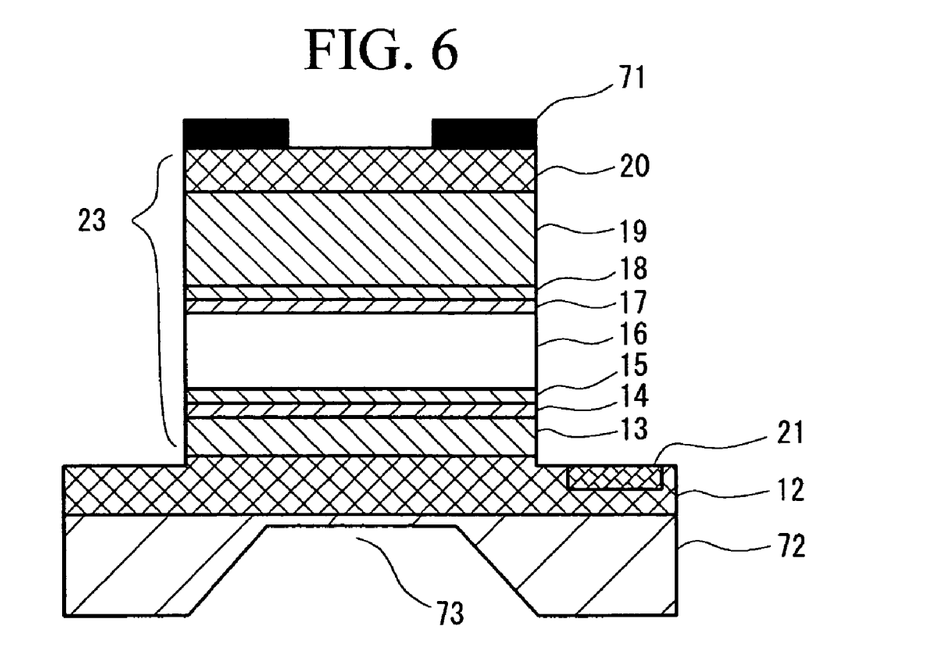
FIG. 6 is a section view of another modification of a PIN-type photodiode in accordance with the present invention.

Further, in the foregoing embodiments, light enters the light absorption layer 16 through the side surface 16a in the end-surface light-entering type of mechanism. However, it is also possible to employ an upper-surface light-entering type in which the upper surface of the mesa structure 23 serves as the light receiving surface, or a bottom-surface light-entering type in which the bottom surface of the structure serves as the light receiving surface. The PIN-type photodiode shown in FIG. 1 may also be modified, for example, to form a ring-like P-side electrode 71, as shown in FIG. 6. In such a structure, light enters through the center of the P-side electrode 71. Alternatively, etching may be performed on the bottom surface of a substrate 72 to form a concavity 73, so that light can enter the light receiving unit through the concavity 73.

In each of the foregoing embodiments, InP and InGaAs are used as the semiconductor materials on an InP substrate. However, the semiconductor materials that can be used in the present invention are not limited to InP and InGaAs. Instead of these materials, other III-V compound semiconductors and mixed crystals such as InAlAs and GaAs can be employed, as long as the bandgap of each light absorption layer is narrower than the bandgap of each corresponding buffer layer, and lattice constant matching can be conducted with these layers.

In the first through fourth embodiments of the invention, preferably, the buffer layer has an impurity concentration of lower than $1 \times 10^{17}$ cm$^{-3}$. When the buffer layer has a relatively low impurity concentration, the depletion region extends so that the electrostatic capacitance of the light receiving device can be reduced. In contrast, influence of electron trapping by the barrier at the interface between the light absorption layer and the buffer layer becomes considerable. Thus, when the buffer layer has an impurity concentration lower than $1 \times 10^{17}$ cm$^{-3}$, it is especially effective to dispose the semiconductor intermediate graded layer between the light absorption layer and the buffer layer in order to restrain the electron trapping. Preferably, the semiconductor intermediate layer may have an impurity concentration lower than $2 \times 10^{18}$ cm$^{-3}$ and a thickness equal to or less than 100 nm.

The graded layers may have a lower refractive index than the light absorption layer. In this case, the graded layers function as cladding layers, and the light absorption layer functions as the core. With this structure, it is possible to confine light incident to the light absorption layer within the core and to move the carriers derived from the light absorption layer to the outside of the light absorption layer. This results in more effective generation of carriers that depend on the amount of incident light and improves the response speed of the light receiving device.

In the foregoing embodiments, PIN-type photodiodes have been described as preferred embodiments of the present invention. However, it is also possible to apply the present invention to other types of semiconductor light-receiving elements such as avalanche photodiodes and phototransistors. Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2002-274305 filed on Sep. 20, 2003, the entire disclosure of which is hereby incorporated by reference.

What is claimed is:

1. A semiconductor light-receiving device for a high-speed and large-capacity optical fiber communication system comprising:
   a) a semi-insulating substrate;
   b) a semiconductor layer of a first conduction type that is formed on the semi-insulating substrate;
   c) a buffer layer of the first conduction type that is formed on the semiconductor layer;
   d) a light absorption layer that is formed on the buffer layer and generates carriers in accordance with incident light;
   e) a semiconductor layer of a second conduction type that is formed on the light absorption layer; and
   f) a high-concentration semiconductor intermediate tunneling layer of the first conduction type that is interposed between the buffer layer and the light absorption layer and has a higher impurity concentration than the buffer layer, the semiconductor intermediate tunneling layer allowing electrons to pass therethrough to the buffer layer due to a tunnel effect, wherein said semi-insulating substrate and layers b)-f) are arranged to form a semiconductor light-receiving device, the high-concentration semiconductor intermediate tunneling layer and the buffer layer being made of an identical material, and wherein the light absorption layer directly contacts the high-concentration semiconductor intermediate tunneling layer.

2. The semiconductor light-receiving device as claimed in claim 1, wherein the impurity concentration of the buffer layer is lower than $1 \times 10^{17}$ cm$^{-3}$.

3. The semiconductor light-receiving device as claimed in claim 1, wherein the high-concentration semiconductor intermediate tunneling layer has an impurity concentration of $2 \times 10^{18}$ cm$^{-3}$, and a film thickness of 100 nm or smaller.

4. The semiconductor light-receiving device as claimed in claim 1, further comprising a contact layer of the first conduction type that is interposed between the semi-insulating substrate and the buffer layer, the contact layer having a high impurity concentration, with a predetermined potential being supplied to the contact layer through an electrode connected to the contact layer.

5. The semiconductor light-receiving device as claimed in claim 1, wherein at least the light absorption layer and the semiconductor layer of the second conduction type form a mesa structure, with light entering the light absorption layer through a side surface of the light absorption layer that is exposed in a process of forming the mesa structure.

6. The semiconductor light-receiving device as claimed in claim 1, wherein the identical material is InP.

7. A semiconductor light-receiving device for a high-speed and large-capacity optical fiber communication system comprising:
   a) a semiconductor substrate of a first conduction type;
   b) a buffer layer of the first conduction type that is formed on the semiconductor substrate and has a lower impurity concentration than the semiconductor substrate;
   c) a light absorption layer that is formed on the buffer layer and generates carriers in accordance with incident light;
   d) a semiconductor layer of a second conduction type that is formed on the light absorption layer; and
   e) a high-concentration semiconductor intermediate tunneling layer of the first conduction type that is interposed between the buffer layer and the light absorption layer and has a higher impurity concentration than the buffer layer, the semiconductor intermediate tunneling layer allowing electrons to pass therethrough to the buffer layer due to a tunnel effect, wherein said semiconductor substrate and layers b)-e) are arranged to form a semiconductor light-receiving device, the high-concentration semiconductor intermediate tunneling layer and the buffer layer being made of an identical material, and wherein the light absorption layer directly contacts the high-concentration semiconductor intermediate tunneling layer.

8. The semiconductor light-receiving device as claimed in claim 7, wherein the identical material is InP.

* * * * *

UNITED STATES PATENT AND TRADEMARK OFFICE
CERTIFICATE OF CORRECTION

PATENT NO. : 7,368,750 B2  Page 1 of 1
APPLICATION NO. : 10/665204
DATED : May 6, 2008
INVENTOR(S) : Gang Wang et al.

It is certified that error appears in the above-identified patent and that said Letters Patent is hereby corrected as shown below:

Title Page;
On the face of the patent, please correct Item (73) to read as follows:

-- (73) Fujitsu Quantum Devices Limited,
 Yamanashi, Japan --

Signed and Sealed this

Seventh Day of July, 2009

JOHN DOLL
*Acting Director of the United States Patent and Trademark Office*